(12) United States Patent
Böhm et al.

(10) Patent No.: US 6,473,335 B2
(45) Date of Patent: Oct. 29, 2002

(54) MRAM CONFIGURATION

(75) Inventors: Thomas Böhm, Zorneding; Helmut Kandolf; Stefan Lammers, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,222

(22) Filed: Jul. 3, 2001

(65) Prior Publication Data

US 2002/0003720 A1 Jan. 10, 2002

(51) Int. Cl.$^7$ ............................................... G11C 11/00
(52) U.S. Cl. ............. 365/158; 365/230.03; 365/230.06
(58) Field of Search .............................. 365/158, 157, 365/230.03, 230.06

(56) References Cited

U.S. PATENT DOCUMENTS

| 5,418,740 A | 5/1995 | Sasaki |
| 5,748,519 A | 5/1998 | Tehrani et al. |
| 5,894,447 A * | 4/1999 | Takashima .................. 365/158 |
| 6,256,224 B1 * | 7/2001 | Perner et al. ........ 365/230.03 |
| 6,256,247 B1 * | 7/2001 | Perner ....................... 365/173 |
| 6,272,040 B1 * | 8/2001 | Salter et al. ................ 365/158 |

FOREIGN PATENT DOCUMENTS

| EP | 0 490 652 A2 | 6/1992 |
| EP | 1003176 A2 | 5/2000 |

* cited by examiner

Primary Examiner—Huan Hoang
(74) Attorney, Agent, or Firm—Laurence A. Greenberg; Werner H. Stemer; Ralph E. Locher

(57) ABSTRACT

A magneto-resistive random access memory (MRAM) configuration is described in which line driver circuits are respectively assigned via connecting nodes to two memory cell arrays, with the result that the area for the driver circuits can practically be halved. Therefore a space-saving architecture and a more efficient MRAM configuration is obtained.

5 Claims, 2 Drawing Sheets

Fig. 4 — Prior Art

MRAM CONFIGURATION

Background of the Invention

Field of the Invention

The invention relates to a magneto-resistive random access memory (MRAM) configuration containing at least two memory cell arrays. In each of the memory cell arrays, memory cells are provided at the crossovers between word lines and bit lines, at least one line type containing the word lines and bit lines is provided with line driver circuits.

As is known, the memory effect of MRAMs is based on a variable resistance of the individual memory cells of the memory. A MRAM memory cell is situated at the crossover point of two lines, namely in particular between a word line and a bit line. The memory cell itself contains two magnetic layers isolated from one another by a thin dielectric layer.

The value of the electrical resistance of such an MRAM memory cell depends, then, on the polarization of the magnetic layers. If both layers are polarized in the same direction, a low value resistance is present in the memory cell, whereas a high value resistance of the electrical resistance is obtained in the event of mutually opposite polarization of the two magnetic layers. In other words, depending on the polarization of the magnetic layers, a high (↑) or low (↓) resistance results for the memory cell containing the two magnetic layers and the intervening dielectric layer.

Of the magnetic layers, one layer is composed of a soft-magnetic material, whereas the other layer is produced from a hard-magnetic material. The soft-magnetic material is chosen such that its polarization can be reversed by a writing current on the word line and the bit line while such polarization reversal by the writing currents is not intended to be possible in the case of the hard-magnetic material.

In order, then, that the magnetic layer made of soft-magnetic material can be polarized in two opposite directions, it is necessary that at least one of two programming currents through the bit line or through the word line can flow in both directions through the respective line. For only then can it be ensured at the crossover point between the word line and the bit line that, given correspondingly directed programming currents at the crossover point, the magnetic field for polarization reversal in the magnetic layer made of the soft-magnetic material is strong enough for the polarization reversal.

The currents which flow through the memory cell are tunneling currents through the thin dielectric layer, so that a "magnetic tunnel junction" or "tunnel junction" is present, which is why the MRAM memory cell is also referred to as a magnetic tunnel junction (MTJ) memory cell.

In the MRAM configuration, high parasitic currents occur on a selected word line or bit line, the currents ultimately being brought about by the numerous crossover points between a selected word line, for example, and the bit lines that cross it. On account of these high parasitic currents, therefore, a large MRAM configuration can only be constructed from a plurality of smaller memory cell arrays. Therefore, however, that, for each memory cell array containing, for example, m word lines and n bit lines, a total of 2m+n or 2n+m line driver circuits are required. For the MPAM configuration in its entirety, containing l memory cell arrays for example, 1(2m+n) or 1(2n+m) line driver circuits are then required. For the line driver circuits, however, a large area is required on a chip containing the MRAM configuration, which is extremely undesirable.

SUMMARY OF THE INVENTION

It is accordingly an object of the invention to provide a MRAM configuration which overcomes the above-mentioned disadvantages of the prior art devices of this general type, in which the area requirement for the line driver circuits is reduced by effective assignment of the latter, thereby obtaining a space-saving architecture.

With the foregoing and other objects in view there is provided, in accordance with the invention, a magneto-resistive random access memory (MRAM) configuration. The MRAM configuration contains at least two memory cell arrays. Each of the memory cell arrays has word lines, bit lines crossing the word lines, and memory cells disposed at crossover points between the word lines and the bit lines. Connecting nodes are provided, and one of the connecting nodes is disposed between and connecting each of the memory cell arrays to each other. Line driver circuits are connected to at least one of the word lines and the bit lines. The line driver circuits are respectively connected to the connecting nodes between the memory cell arrays. Switching transistors are provided. One of the switching transistors is disposed between one of the memory cell arrays and one of the connecting nodes so that the line driver circuits are respectively assigned to different ones of the memory cell arrays.

In the case of the MRAM configuration of the type mentioned in the introduction, the object is achieved according to the invention by virtue of the fact that the line driver circuits are respectively connected to connecting nodes between two memory cell arrays and a respective switching transistor is present between the connecting node and the two memory cell arrays.

In principle, the configuration of the MRAM configuration effects a departure from an obvious solution to the above problems which is based on respectively placing a current source or current sink at each end of a memory cell array. Rather, in the MRAM configuration according to the invention, the line driver circuits are disposed in such a way that they can be assigned to different memory cell arrays, which results in that the line driver circuits required in total are approximately halved compared with the prior art. Equally, it is possible to reduce the outlay for the current sources in the line driver circuits since a current source is allocated to two memory cell arrays in the present invention.

A development of the invention provides for the connecting node between two memory cell arrays to be connected to ground potential via an element having an adjustable voltage drop. As a result, a writing current, having traversed a memory cell array, readily passes to the ground potential via the output side connecting node of the memory cell array and the element having an adjustable voltage drop. By way of example, the adjustable voltage drop can be produced by a variable resistor, a variable transistor diode or an adjustable voltage source. The resulting adjustable voltage ensures that parasitic currents through the memory cells connected to the selective word or bit line can be minimized.

A respective series circuit containing a current source and a writing driver transistor is advantageously used for the line driver circuits. In this manner, the current source is assigned to two of the memory arrays. By way of example, an n-channel MOS field-effect transistor may be chosen for the writing driver transistor, and, moreover, this also applies to the switching transistor and the transistor diode.

Other features which are considered as characteristic for the invention are set forth in the appended claims.

Although the invention is illustrated and described herein as embodied in a MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

FIG. 4 is a layout of an MRAM memory cell array with the MTJ memory cells at crossover points between word lines and bit lines according to the prior art.

DESCRIPTION OF THE PREFERRED EMBODIMENTS

Figure 1:
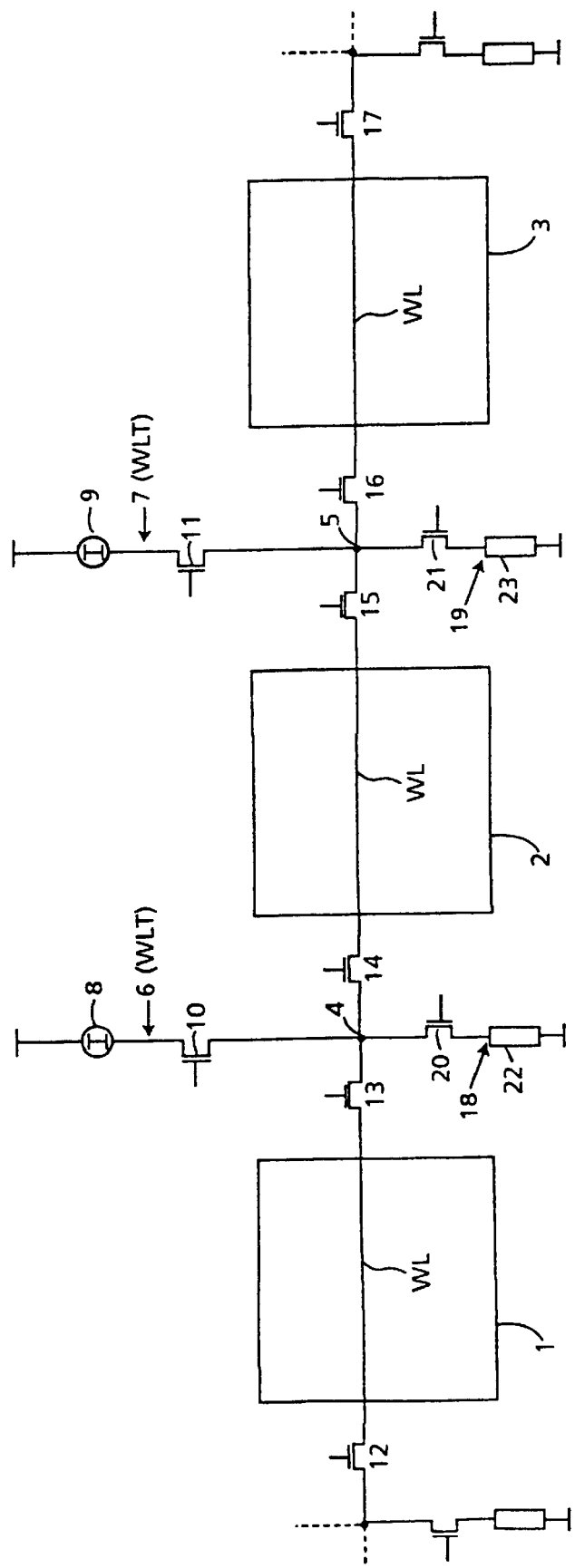
FIG. 1 is a block circuit diagram for elucidating a MRAM configuration according to the invention.

In all the figures of the drawing, sub-features and integral parts that correspond to one another bear the same reference symbol in each case. Referring now to the figures of the drawing in detail and first, particularly, to FIG. 2 thereof, there is shown a MRAM memory cell situated at a crossover point of two lines, namely in particular between a word line WL and a bit line BL. The memory cell itself contains two magnetic layers ML isolated from one another by a thin dielectric layer TL.

The value of the electrical resistance of the MRAM memory cell depends, then, on a polarization of the magnetic layers ML. If both layers ML are polarized in the same direction, a low value of the resistance $R_c\downarrow$ is present in the memory cell, whereas a high value $R_c\uparrow$ of the electrical resistance is obtained in the event of mutually opposite polarization of the two magnetic layers ML. In other words, depending on the polarization of the magnetic layers ML, a high ($\uparrow$) or low ($\downarrow$) resistance results for the memory cell containing the two magnetic layers ML and the intervening dielectric layer TL.

Of the magnetic layers ML, one layer is composed of a soft-magnetic material, whereas the other layer is produced from a hard-magnetic material. The soft-magnetic material is chosen such that its polarization can be reversed by a writing current on the word line WL and the bit line BL, while such polarization reversal by the writing currents is not intended to be possible in the case of the hard-magnetic material.

In order, then, that the magnetic layer ML made of soft-magnetic material can be polarized in two opposite directions, it is necessary that at least one of two programming currents $I_{BL}$ through the bit line BL or $I_{WL}$ through the word line WL can flow in both directions through the respective line WL or BL. For only then can it be ensured at the crossover point between the word line WL and the bit line BL that, given correspondingly directed programming currents $I_{BL}$ and $I_{WL}$ at the crossover point, the magnetic field for polarization reversal in the magnetic layer ML made of soft-magnetic material is strong enough for the polarization reversal.

The currents which flow through the memory cell are tunneling currents through the thin dielectric layer TL, so that a "magnetic tunnel junction" or "tunnel junction" is present, which is why the MRAM memory cell is also referred to as a magnetic tunnel junction (MTJ) memory cell.

FIG. 4 shows an MRAM memory cell array containing word lines $WL_{i-1}$, $WL_i$ and $WL_{i+1}$, bit lines $BL_{k+1}$, $BL_k$ and $BL_{k-1}$ and also MTJ memory cells with respective resistors $R_C$ at the crossover points of the lines.

The word lines WL and the bit lines BL in such a memory cell array are respectively provided with word line driver circuits and bit line driver circuits which output a corresponding programming or reading current onto their assigned word line and bit line, respectively. FIG. 4 diagrammatically shows such a word line driver $WLT_i$ and bit line driver $BLT_k$ for the word line $WL_i$ and the bit line $BL_k$, respectively. Such word line drivers and bit line drivers are present for each word line and bit line, respectively, for the entire memory cell array containing m word lines and n bit lines. In this case, at least on one of the two lines, that is to say either at least on the word lines or at least on the bit lines, there must be two drivers provided, namely a respective driver at each end of the lines, in order that the current passing through the lines can be driven in each direction of the respective line.

In the MRAM configuration, high parasitic currents occur on a selected word line or bit line, the currents ultimately being brought about by the numerous crossover points between a selected word line WL, for example, and the n bit lines that cross it. On account of these high parasitic currents, therefore, a large MRAM configuration can only be constructed from a plurality of smaller memory cell arrays. Therefore, however, that, for each memory cell array containing, for example, m word lines and n bit lines, a total of 2m+n or 2n+m line driver circuits are required. For the MRAM configuration in its entirety, containing l memory cell arrays for example, 1(2m+n) or 1(2n+m) line driver circuits are then required. For these line driver circuits, however, a large area is required on a chip containing the MRAM configuration, which is extremely undesirable.

Figure 2:
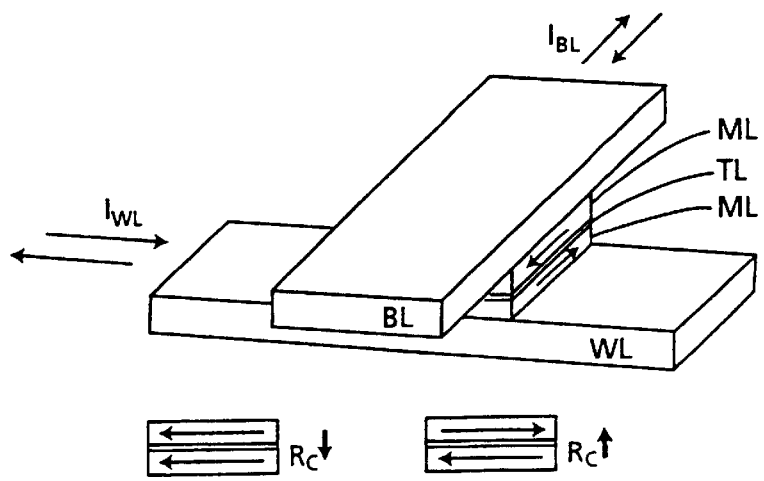
FIG. 2 is a diagrammatic, perspective view of an MTJ memory cell.
Figure 3:
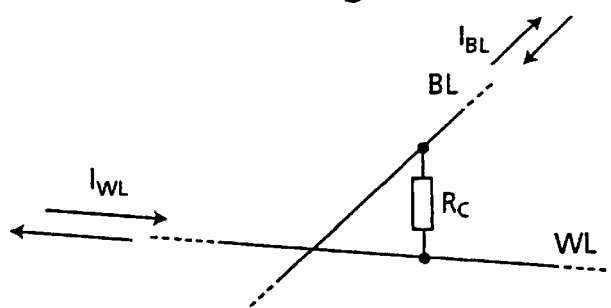
FIG. 3 is an equivalent circuit diagram for the MTJ memory cell shown in FIG. 2.
Figure 3:
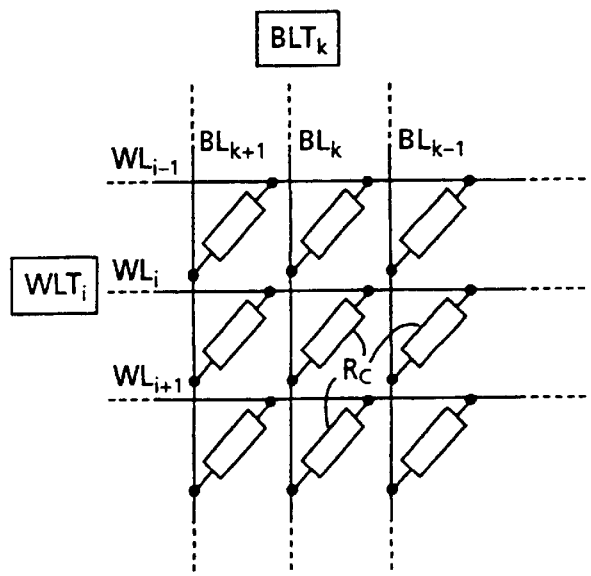

FIG. 1 shows a block diagram of the MRAM configuration according to the invention, containing three memory cell arrays 1, 2, 3 which are each constructed in the manner shown in FIG. 4 and contain the MTJ memory cells of the type shown in FIGS. 2 and 3 at the crossover points between word lines WL and bit lines BL. Instead of three memory cell arrays, it is also possible, of course, to provide a larger number of memory cell arrays.

Furthermore, FIG. 1 shows the MRAM configuration in which common word lines WL (only one word line WL is shown in order to simplify the illustration) pass through the memory cell arrays 1 to 3. It goes without saying that it is also possible for a plurality of memory cell arrays to be provided with common bit lines or with common word lines and common bit lines.

In the MRAM configuration of the exemplary embodiment of FIG. 1, connecting nodes 4, 5 between the memory cell arrays 1 and 2 and, respectively, between the memory cell arrays 2 and 3 are respectively connected to a word line driver circuit 6 and 7. The word line driver circuits 6 and 7 contain driver current sources 8 and 9, respectively, and writing driver transistors 10 and 11, respectively. In this case, the driver current sources 8 and 9 may be polarized in the manner shown in FIG. 1. By way of example, n-channel MOS transistors may be used for the writing driver transistors 10 and 11.

Furthermore, in the MRAM configuration according to the invention, respective switching transistors 12 to 17 are provided between the individual connecting nodes 4 and 5 and also the memory cell arrays 1 to 3. In this case, the switching transistors 12 and 13 are assigned to the memory cell array 1, while the switching transistors 14 and 15 are associated with the memory cell array 2 and the switching transistors 16 and 17 are provided for the memory cell array 3.

Finally, the connecting nodes 4 and 5 are also respectively connected to a ground potential via an element 18 and 19 having an adjustable voltage drop. The element 18 and 19 may contain a variable transistor diode 20 and 21, respectively, and an adjustable voltage source 22 and 23, respectively.

Instead of a variable transistor diode, a variable resistor 20, 21 may also be provided.

Suppose that in the MRAM configuration of FIG. 1, the current direction for writing a "0" to memory cells of the memory cell arrays 1 to 3, the memory cells being connected to the word line WL, in each case runs from left to right, while the writing of a "1" to the memory cells of the memory cell arrays 1 to 3 requires a current flow from right to left, as is indicated by arrows. The same convention shall apply, of course, to the remaining word lines WL of the memory cell arrays which are not specifically shown. For writing, a corresponding current must flow in the respective bit lines BL.

In the MRAM configuration of FIG. 1, under the above assumptions, the current source 8 is used for writing a "1" to the memory cell array 1 and for writing a "0" to the memory cell array 2. In a similar manner, the current source 9 serves for writing a "1" to the memory cell array 2 and for writing a "0" to the memory cell array 3.

By way of example, if a "1" is to be written to the memory cell array 2, i.e. a memory cell of the memory cell array 2, which memory cell is connected to the word line WL, then the writing current required for this purpose is supplied by the current source 9. The writing driver transistor 11 is turned on, in which state it can feed a "1" into the memory cell array 2 and a "0" into the memory cell array 3 via the connecting node 5. To ensure that it is actually the "1", rather than the "0", that is written to the memory cell array 2, the switching transistor 15 is turned on, while the switching transistor 16 is driven into the off state.

The writing current then passes through the memory cell array 2, in which it reverses the polarization of a memory cell located at the crossover point between the word line WL and a bit line that is likewise being driven, via the switching transistor 14, which is in the on state, with transistors 10 and 13 turned off, and via the element 18 having an adjustable voltage drop to ground potential.

The transistor 20 is thus in the on state when a "1" is written to the memory cell array 2 or a "0" is written to the memory cell array 1. Appropriate setting of the voltage drop across the variable voltage source 22 has the effect of minimizing the parasitic current through the memory cells of the selected word line WL.

In the MRAM configuration, then, the memory cell array 1 to 3 is selected by appropriate setting of the switches formed by the switching transistors 12 to 17. What is important here is that all non-selected word and bit lines of the selected memory cell array are put at a defined potential before the actual writing operation in order that the parasitic currents are minimized or eliminated.

Since, in the MRAM configuration according to the invention, the line driver circuits 6 and 7 are jointly used for in each case two memory cell arrays 1 and 2 and, respectively, 2 and 3, the required chip area can be considerably reduced. A further reduction of the chip area can be achieved if, instead of the n-channel MOS transistors shown in the exemplary embodiment of FIG. 1, respective boosted switches are used.

We claim:

1. A magneto-resistive random access memory (MRAM) configuration, comprising:

at least two memory cell arrays, each of said memory cell arrays having word lines, bit lines crossing said word lines, and memory cells disposed at crossover points between said word lines and said bit lines;

connecting nodes, one of said connecting nodes disposed between and connecting each of said memory cell arrays to each other;

line driver circuits connected to at least one of said word lines and said bit lines, said line driver circuits are respectively connected to said connecting nodes between said memory cell arrays;

switching transistors, one of said switching transistors disposed between one of said memory cell arrays and one of said connecting nodes so that said line driver circuits are respectively assigned to different ones of said memory cell arrays; and elements having an adjustable voltage drop, one of said elements disposed between one of said connecting nodes and a ground potential connecting said connecting nodes to the ground potential.

2. The MRAM configuration according to claim 1, wherein said elements each,have a transistor and a component selected from the group consisting of variable resistors, variable transistor diodes and adjustable voltage sources.

3. The MRAM configuration according to claim 2, wherein said line driver circuits each respectively contain a series circuit formed of a current source and a writing driver transistor.

4. The MRAM configuration according to claim 3, wherein said switching transistors, said transistor of said elements and said writing driver transistor are at least in part n-channel MOS field-effect transistors.

5. The MRAM configuration according to claim 3, wherein said current source is respectively assigned to two of said memory cell arrays.

* * * * *

UNITED STATES PATENT AND TRADEMARK OFFICE
CERTIFICATE OF CORRECTION

PATENT NO.    : 6,473,335 B2
DATED         : October 29, 2002
INVENTOR(S)   : Thomas Böhm et al.

It is certified that error appears in the above-identified patent and that said Letters Patent is hereby corrected as shown below:

<u>Title page,</u>
Item [30], should read as follows:
-- Jul. 3, 2000   (DE) .................................. 100 32 271.9 --

Signed and Sealed this

Eighteenth Day of March, 2003

JAMES E. ROGAN
*Director of the United States Patent and Trademark Office*